United States Patent [19]
Huang et al.

[11] Patent Number: 5,138,431
[45] Date of Patent: Aug. 11, 1992

[54] LEAD AND SOCKET STRUCTURES WITH REDUCED SELF-INDUCTANCE

[75] Inventors: Chin-Ching Huang; Ronald J. Molnar, both of San Jose, Calif.

[73] Assignee: VLSI Technology, Inc., San Jose, Calif.

[21] Appl. No.: 473,067

[22] Filed: Jan. 31, 1990

[51] Int. Cl.⁵ .............................. H01L 23/48
[52] U.S. Cl. .............................. 357/71; 357/74
[58] Field of Search ............... 357/71, 74; 172/54.4; 174/52.4

[56] References Cited
U.S. PATENT DOCUMENTS

| | | | |
|---|---|---|---|
| 4,372,809 | 2/1983 | Grewal et al. | 357/71 |
| 4,441,119 | 4/1984 | Link | 357/74 |
| 4,707,724 | 11/1987 | Suzuki et al. | 357/71 |
| 4,761,518 | 8/1988 | Butt et al. | 357/74 |
| 4,835,593 | 5/1989 | Arnold et al. | 357/71 |

Primary Examiner—Eugene R. LaRoche
Assistant Examiner—R. Ratliff
Attorney, Agent, or Firm—Majestic, Parsons, Siebert & Hsue

[57] ABSTRACT

Where a lead frame or lead structure in a plastic or ceramic-type package is made of a ferromagnetic material, an electrically conducting non-ferromagnetic material is added to create a low-inductance path between a semiconductor die and the terminals of the package to reduce self-inductance in the package. To provide an effective low-inductance current path to the ferromagnetic lead frame, the cross-sectional dimensions of the non-ferromagnetic path is preferably no less than 50 microinches. Where the lead frame or lead structure is made from an electrically conducting non-ferromagnetic material, a ferromagnetic material is added to provide strength and rigidity to the lead frame or lead structure. The material added may be plated, spot plated, or cladded onto the starting material. The leads or terminals of a socket may be also be constructed in a similar manner to improve its wear-resistance and rigidity while maintaining a low self-inductance.

20 Claims, 4 Drawing Sheets

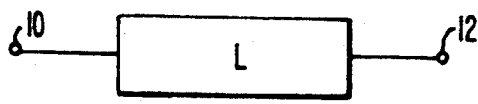
FIG._1.
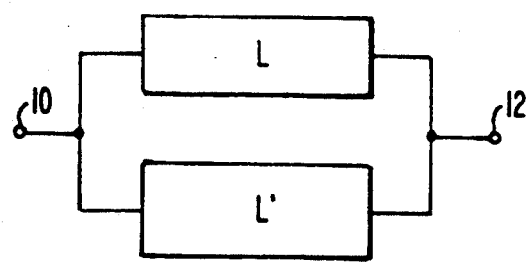
FIG._2.
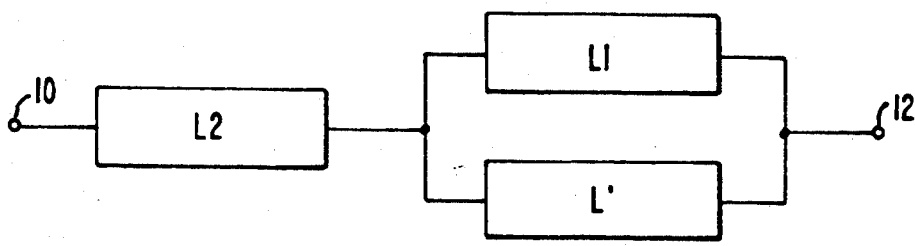
FIG._3.
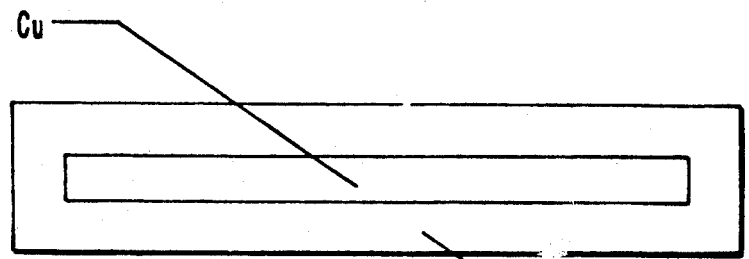
FIG._6F.
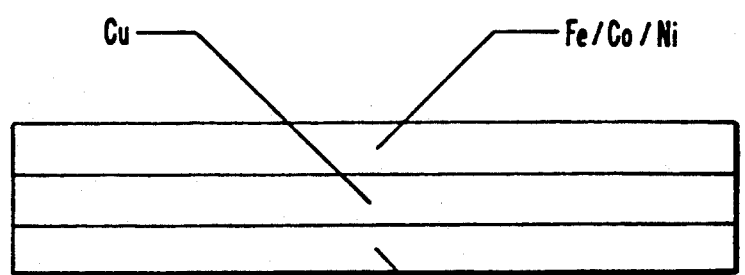
FIG._6G.

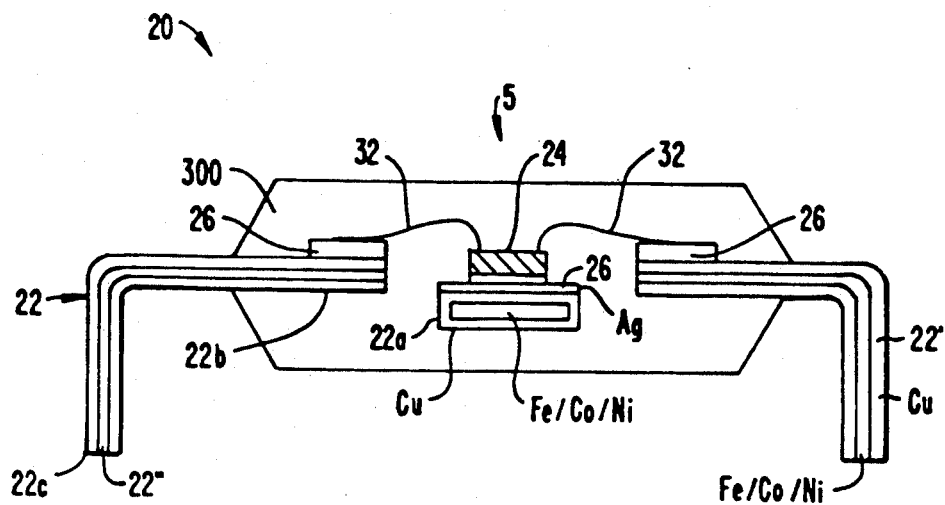
FIG._4.
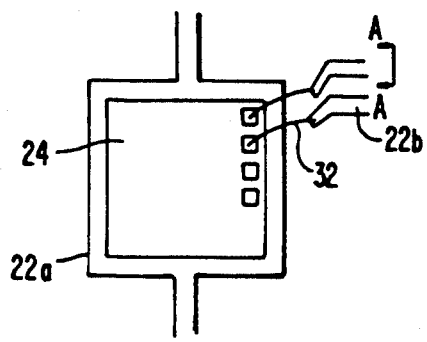
FIG._5.
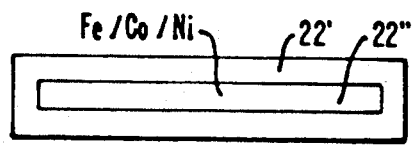
FIG._6A.
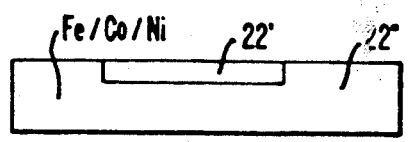
FIG._6C.
FIG._6B.
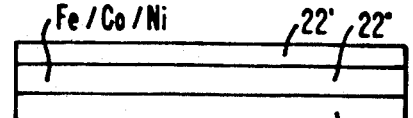
FIG._6D.
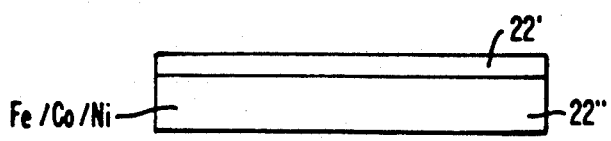
FIG._6E.

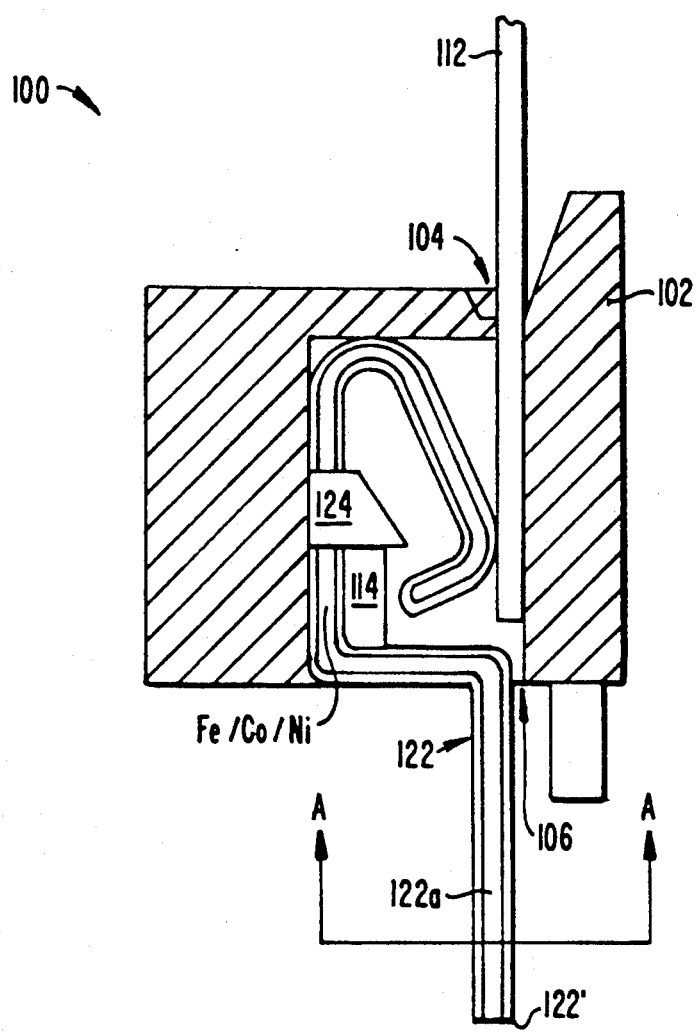
FIG._7.
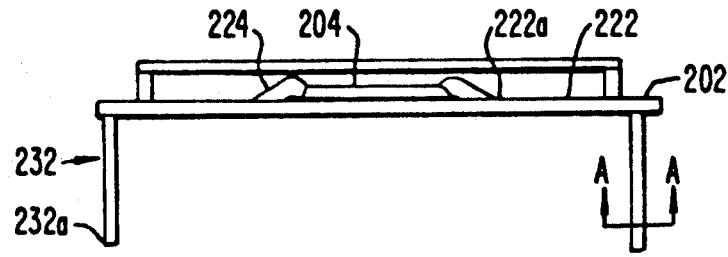
FIG._8.

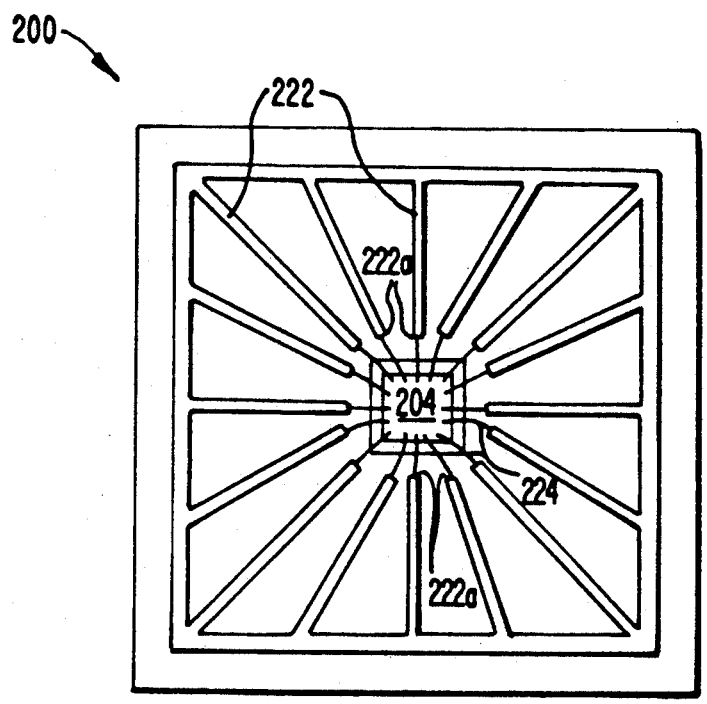
FIG._9.

LEAD AND SOCKET STRUCTURES WITH REDUCED SELF-INDUCTANCE

BACKGROUND OF THE INVENTION

This invention relates in general to semiconductor packages and in particular to lead and socket structures with reduced self-inductance.

The leadframes initially used by the electronics industry for semiconductor packaging were made of Kovar (29% nickel, 17% cobalt and 54% iron). For at least the last ten years, Alloy 42 (42% nickel, 58% iron) has largely replaced Kovar for use in leadframes. Alloy 42 was originally formulated as a glass-seal alloy for use as terminal pins on light bulbs and vacuum tubes.

The primary concern in the packaging industry insofar as leadframes are concerned are the mechanical, electrical and thermal properties of the leadframe material. The magnetic properties of these materials have largely been ignored. When a conductor made of ferromagnetic material is used to conduct electric current, where the magnetic material has appreciable magnetic permeability within the frequency of the current, the conductor exhibits a relatively large self-inductance. In other words, on account of the magnetic permeability of the material of the conductor through which current passes, an inductance develops in the conductor which resists the passage of current. High self-inductance causes noise on power and ground lines during simultaneous switching of outputs and causes propagation delays.

With the rapid movement in the electronics industry to increase the density of circuit components in a given area on semiconductor chips, simultaneous switching noises and propagation delays caused by self-inductance become an important issue, particularly in the sub-nanosecond time frame of high-speed very large scale integrated circuit (VLSI) type designs. The self-inductance problem in semiconductor packages has been recognized by the packaging industry. This is indicated, for example, in two articles:

(1) Shrivastava et al., "Inductance Calculation and Optimal Pin Assignment for Pin Grid Array and Chip-Carrier Packages," Abstract, pages 384-391, Phoenix, Arizona;

(2) Hamilton et al., "Molded Carrier Rings for Fine Pitch Surface Mount Packages," Abstract, pages 504-512.

It is therefore desirable to provide leadframes and other structures for use in semiconductor packaging where self-inductance is reduced.

SUMMARY OF THE INVENTION

Leadframes have been constructed using ferromagnetic material such as Kovar or Alloy 42 for a number of reasons. Such materials have great tensile strength and lend rigidity to the leadframe structure so that the leads are not easily bent. Alloy 42 has been widely used for leadframes since its thermal expansion coefficient closely matches that of silicon. Copper leadframes have also been used in some circumstances instead of leadframes made of Alloy 42. Copper is advantageous over Alloy 42 in that it is slightly cheaper, but more importantly, the thermal conductivity of copper is nearly twice that of Alloy 42. Therefore, packages using copper leadframes can dissipate nearly twice the power as packages using Alloy 42 leadframes. On the other hand, copper has less tensile strength than Alloy 42 so that the "softer" copper leads are more easily bent in handling. Bent leads are unacceptable since they are not in the proper positions for connection to other devices. Copper also has a higher thermal expansion coefficient than Alloy 42. Since most existing equipment was originally tailored for making leadframes using Alloy 42, changing to copper leadframes has required a large investment to re-tool molds, dambar removal dies, and trim and form dies. For these reasons, the use of copper leadframes is still not as common as Alloy 42 for some packages.

This invention is based on the observation that the self-inductance of ferromagnetic (e.g. Alloy 42) leadframes can be reduced by providing an alternative path for current where the path is made of a non-ferromagnetic material. Since the alternative path has much lower inductive reactance to current than the ferromagnetic leadframe, most of the current will seek and flow through this alternative path instead of through the ferromagnetic leadframe (e.g. Alloy 42). The invention is also applicable to ceramic-type packages by providing an alternative path for the current between the semiconductor die and other devices using non-ferromagnetic material.

Thus, one aspect of the invention is directed towards a lead structure for electrically connecting an electronic component (which may be a semiconductor die or simply a transistor) to other devices. The structure comprises a layer of an electrically conducting ferromagnetic first material. The layer has a portion forming a terminal suitable for electrical connection to other devices and a lead or finger near the components for electrical connection to the components. The structure further comprises a path made of an electrically conducting non-ferromagnetic second material on or in said layer or separated from said layer by an intermediate layer, for electrically connecting the component to said terminal. The second material is other than gold, silver, copper or aluminum. In this manner the self-inductance of the structure is reduced. The second material may be tin or palladium.

As for copper leadframes or leadframes constructed using non-ferromagnetic material, applicants propose the use of one or more layers of ferromagnetic material on and covering at least a portion of the leadframe to provide rigidity for the structure. Again, the addition of ferromagnetic layers to a non-ferromagnetic lead structure is applicable to a ceramic packages or other lead structures to increase rigidity.

Hence another aspect of the invention is directed towards a leadframe for electrically connecting an electronic component (a semiconductor die or other devices such as a transistor) to other devices. The structure comprises a layer of an electrically conducting non-ferromagnetic first material. The layer has a portion forming a terminal suitable for electrical connection to other devices and a lead or finger near the component for electrical connection to the components. The structure further includes one or more second layers of an electrically conducting ferromagnetic second material on or separated from the non-ferromagnetic layer by an intermediate layer, and covering at least a portion of the first layer to provide rigidity for the structure.

In conventional leadframe manufacturing, Alloy 42 leadframes have been plated with aluminum, gold or silver to provide a reliable metallurgical bond to aluminum and gold wires and to provide a wettable surface for quality soldering. Gold over nickel plating of Alloy 42 leadframes was popular until the price of gold approached $800.00 per ounce. When this occurred, spot-plating techniques were developed to plate gold only in the die attach pad and wire bond regions on one side of the leadframe strips as a cost reduction measure. In this type of leadframes, an Alloy 42 leadframe is first plated with a layer of nickel and gold is plated over the nickel layer. The nickel layer is used as an intermediate layer to prevent diffusion and to improve adhesion of the gold to the Alloy 42 during the plating process. In an effort to reduce plated leadframe costs further, silver was substituted for gold over a thin copper spot-plating or "strike." The copper layer is applied so that the silver plating would adhere better to the leadframe. Thus typically, the thickness of the copper layer is of the order of 5 microinches and not more than 10 microinches. The copper layer is applied only for better silver adhesion. When the copper layer is as thin as 5 microinches, particularly in comparison with the thick Alloy 42 leadframe, the copper layer does not appreciably reduce self-inductance.

According to another aspect of the invention, a copper, tin or palladium (or any electrically conducting non-ferromagnetic material other than gold, silver or aluminum) path provided as an alternative path for current flow between the semiconductor die and other devices has a cross-section such that its cross-sectional dimensions are not less than about 50 microinches. Therefore, the path provided by this invention is an order of magnitude larger in a cross-sectional dimension than the copper layer in conventional leadframe manufacturing. Thus the path will significantly reduce self-inductance. In the preferred embodiment, the thickness of the path is in the range of about 50–200 microinches.

Thus another aspect of the invention is directed towards a lead structure for supporting an electronic component where the structure comprises a layer of a ferromagnetic material for supporting the components. The layer has a portion forming a terminal suitable for connection to other devices and a lead or finger near the components for electrical connection to the components. The structure also includes a path made of an electrically conducting non-ferromagnetic material other than gold, silver and aluminum on or in said layer or separated from said layer by an intermediate layer, for electrically connecting the components to said terminal. The path has a cross-section such that its cross-sectional dimensions are not less than about 50 microinches so that the self-inductance of the structure is reduced.

Another aspect of the invention is directed towards a socket for use with the semiconductor package which has leads. The socket includes a housing having a chamber therein. The chamber has a first opening for receiving a lead of the package and a second opening. The socket further includes an electrically conducting elongated member inside the chamber positioned to contact at a first point the lead of the package after the lead is inserted into the chamber. The member has a portion which extends outside the chamber through the second opening. The portion is suitable for connection to other devices so as to electrically connect the lead of the package to such other devices. The member is composed of a ferromagnetic first material to provide rigidity to the member and a non-ferromagnetic material electrically connecting second material to reduce self-inductance.

BRIEF DESCRIPTION OF THE DRAWINGS

FIG. 1 is a schematic view of an inductor to illustrate the invention.

FIG. 2 is a schematic view of two inductors connected in parallel to illustrate the invention.

FIG. 3 is a schematic view of two inductors arranged in parallel and in series with a third inductor to illustrate the invention.

FIG. 4 is a cross-sectional view of a plastic-type semiconductor package to illustrate the invention.

FIG. 5 is a slightly enlarged view of a portion of the package of FIG. 4 without the plastic molding along the direction 5 in FIG. 4 to illustrate the invention.

FIGS. 6A–6G are cross-sectional views along the line A—A in FIG. 5 to illustrate different embodiments of the invention.

FIG. 7 is a cross-sectional view of a socket used for semiconductor packages to illustrate another aspect of the invention.

FIG. 8 is a cross-sectional view of a ceramic-type package to illustrate the invention.

FIG. 9 is a top view of a ceramic package with the lid removed to illustrate the invention.

DETAILED DESCRIPTION OF THE INVENTION

As discussed above, conventional leadframes are made of a ferromagnetic material such as Kovar or Alloy 42. The leadframe has a portion which forms a terminal suitable for connection to other devices. The leadframe has another portion which forms a finger or lead adjacent to an electronic component such as a semiconductor die. A selected point of the die is then connected to the finger or lead by means of a bonding wire. The leadframe also frequently includes a center pad used to provide physical support for the die. The terminal is frequently connected to a substrate such as a printed circuit board by means of soldering. The printed circuit board in turn connects the terminal to other devices on the board. In this manner a selected point on the semiconductor die is connected through the bonding wire, the leadframe and the printed circuit board to other devices.

As explained above, where the leadframe is made of a ferromagnetic material such as Kovar or Alloy 42, the leadframe has considerable self-inductance. The self-inductance can introduce significant switching noise and propagation delay which would be a problem in semiconductor packages. The self-inductance of the leadframe between the lead or finger and the terminal is indicated symbolically in FIG. 1.

Thus if terminal 10 represents the terminal of the leadframe and terminal 12 represents a finger or lead of the leadframe, the self-inductance of the leadframe between the finger and the terminal is L in reference to FIG. 1. Applicants suggest the addition of an additional path between terminal 10 and finger 12 where the path is made of a non-ferromagnetic material. The self-inductance L' introduced by such alternative path is much lower than L introduced by the ferromagnetic leadframe. Since both the leadframe and the path electrically connect terminal 10 to finger 12, the two inductances are placed in parallel, as illustrated in FIG. 2.

As shown in FIG. 2, the non-ferromagnetic path provides a path for the current between terminal 10 and finger 12 which has a much lower inductance compared to the ferromagnetic leadframe. Therefore, most of the current will flow through the non-ferromagnetic path instead of the ferromagnetic leadframe. The end result is a much lower self-inductance experienced by the current between the terminal and the finger. The provision of an alternative non-ferromagnetic path therefore greatly reduces switching noise and increases the speed of signal transmission.

Even if the non-ferromagnetic path does not extend all the way between the terminal 10 and finger 12, the self-inductance of the leadframe is still reduced. This is illustrated in reference to FIG. 3. Where the non-ferromagnetic path does not extend all the way between terminal 10 and finger 12, the self-inductance of the portion of the ferromagnetic leadframe which forms a parallel path to the non-ferromagnetic path is indicated as L1, and the self-inductance of the portion of the leadframe which is in series with a non-ferromagnetic path is indicated as L2 in FIG. 3. Therefore, most of the current between terminal 10 and finger 12 will flow through the portion of the leadframe in series with the path having inductance L2 and then through the non-ferromagnetic path having inductance L'. While the end result is not as desirable as that illustrated in FIG. 2, the self-inductance of the lead structure as a whole is nevertheless reduced to a value below that of the leadframe without the non-ferromagnetic path at all.

FIG. 4 is a cross-sectional view of a plastic-type semiconductor package 20 to illustrate the invention. Package 20 includes a leadframe 22. Leadframe 22 has a lead structure made from a layer of a ferromagnetic material (iron, cobalt or nickel, or an alloy made of two or three of the metals) sandwiched on both sides by two layers of copper. Leadframe 22 has a pad portion 22a which is down set for supporting a die 24. Separating the die and path 22a is a layer of silver 26 which is provided for possible wire bonding. Leadframe 22 has fingers or leads 22b near the die 24 and terminals 22c suitable for connection to substrates such as a printed circuit board. Silver is spot-plated onto leads or fingers 22b and die attach pad 22a to provide better bonding to bonding wires 32 which normally connect the leads of fingers to selected points on the die 24.

Thus as shown in FIG. 4, the copper outer layers 22' and the inner ferromagnetic layer 22" form a sandwich configuration where the outer copper layers 22' forms a continuous path between finger or lead 22b and terminal 22c. Therefore, most of the current flowing between the finger and the terminal will seek and pass through the copper layer instead of through the ferromagnetic layer, thereby greatly reducing the self-inductance of package 20.

While ferromagnetic leadframes have been plated with copper in conventional leadframe manufacturing, such copper layer is typically very thin and does not provide an adequate alternative path for the current. According to tests performed by Applicants, inductance of the leadframe is reduced significantly when the layer 22' is over about 100 microinches in thickness, although Applicants expect some reduction in inductance with layer 22' is over 50 microinches thick. In FIG. 4, however, the copper layer 22' is at least about 50 microinches in thickness, thereby providing a path with sufficient cross-sectional thickness to be a viable alternative path for the current. In the preferred embodiment, the layer 22' is in the range of about 100–200 microinches in thickness.

In addition to copper, silver, gold and aluminum, other non-ferromagnetic materials which may be used to provide the low inductance path include tin and palladium. All such materials are within the scope of the invention. These materials may be used instead of copper in the embodiment of FIG. 4. In the preferred embodiment, paths made of such materials are at least 50 microinches thick, and may be about 50–200 microinches in thickness.

FIG. 5 is a slightly enlarged view of path 22a, die 24 and lead portions 22b of FIG. 4 along the direction 5 with the plastic molding removed. The low inductance, non-ferromagnetic path may be provided in different manners in leadframe 22. FIGS. 6A–6E are cross-sectional views of fingers or leads 22b taken along the line A—A in FIG. 5 to illustrate five different ways in which the non-ferromagnetic path may be provided in leadframe 22.

As shown in FIG. 6A, in one embodiment, all the otherwise exposed surfaces of the ferromagnetic layer are covered by the non-ferromagnetic layer. As shown in FIG. 6B, in another embodiment, the non-ferromagnetic layer forms an elongated path on top of one side of the leadframe 22 where the path runs continuously from lead or finger 22b to terminal 22c. The configurations of FIGS. 6B, 6D, 6E may be obtained by spot-plating, that is, covering surfaces of the leadframe on which plating is undesired and plating only the exposed area resulting in the embodiments shown in FIGS. 6B, 6D, 6E. Alternatively, the configuration in FIG. 6B may be obtained by etching a leadframe completely covered by the non-ferromagnetic layer (the leadframe shown in FIG. 6A) so that only an elongated path remains as shown in FIG. 6B.

Instead of plating, leadframe 22 may also be manufactured by a cladding process, resulting in the configurations in FIGS. 6C–6E. As is known to those skilled in the art, cladding is a process which attaches a body of one material to a second body of another material by mechanically forcing them together. Thus the leadframe 22 may be obtained by forcing a narrow strip 22' of non-ferromagnetic material into the surface of a wider strip 22" of ferromagnetic material. The lead shown in FIG. 6D may be obtained by covering both sides of the ferromagnetic lead by two layers of non-ferromagnetic material of the same shape and size and pressing them together in a sandwich configuration. The lead in FIG. 6E may be obtained by pressing two layers together, one layer of ferromagnetic material and the second layer of non-ferromagnetic material of substantially the same shape and size.

While FIGS. 6A–6E illustrate certain practical embodiments for making leadframe 22, it will be understood that other configurations are possible for incorporating a non-ferromagnetic path on or in leadframe 22 where the two materials may even be intertwined in a more complicated manner; all such configurations are within the scope of the invention. Furthermore, in certain embodiments, it may be desirable not to plate or clad the non-ferromagnetic material directly onto the ferromagnetic material, but to separate them by an intermediate layer which enhances adhesion and/or prevents diffusion. Such an intermediate layer may be made of a suitable material such as titanium or nickel. Such intermediate layers may also be incorporated in the later embodiments described below in reference to FIGS. 6F, 6G and 7–9.

As discussed above, copper leadframes are disadvantageous since they have lower tensile strength and higher thermal expansion coefficients. Copper leadframes, on the other hand, are advantageous since they have higher thermal conductivity and lower inductance. Another aspect of the invention is based on the observation that the tensile strength of a copper (or any other electrically conducting non-ferromagnetic material) leadframe may be improved by plating or cladding onto the copper leadframe one or more layers of a ferromagnetic material. Thus a leadframe similar to leadframe 22 in FIG. 4 may be constructed where layer 22" is made of copper but layers 22' are made of a ferromagnetic material such as iron, cobalt or nickel, or an alloy made of two or three of the ferromagnetic metals. Two different embodiments of such a leadframe are illustrated in FIGS. 6F and 6G, which are cross-sectional views of leads 22b along line A—A in FIG. 4 with the above stated modifications for a non-ferromagnetic (copper) leadframe to which ferromagnetic layers are added for improving tensile strength.

As shown in FIG. 6F, a copper leadframe may be completely covered by an outer layer of ferromagnetic material. Alternatively, two outer layers of ferromagnetic material of substantially the same shape and size may be cladded on both sides of the copper layer to make the leadframe as shown in FIG. 6G. Obviously, configurations similar to FIGS. 6B, 6C and 6E are also possible with the labels of copper and ferromagnetic material switched. It is also possible to provide leadframes where the ferromagnetic material appears inside the copper layer forming vias or other configurations. All such configurations are within the scope of the invention.

The invention has been described above in its application to semiconductor packages. It will be understood, however, that it is applicable also to lead structures for connecting discrete electronic components such as transistors, capacitors, inductors and resistors to other electronic devices. All such applications are within the scope of the invention. In addition, this invention is also applicable to sockets for semiconductor packages as described below.

FIG. 7 is a cross-sectional view of a socket 100. Socket 100 includes a housing 102 having two openings 104, 106. Opening 104 is adapted to receive a terminal or lead 112 from a semiconductor package or a discrete electronic component. Socket 100 also includes an electrically conducting elongated member 122, which is shaped so that it is spring-loaded when placed in the chamber. Housing 102 defines therein a chamber for housing a portion of the member 122 in such manner that when lead 112 is inserted into the chamber 114, the portion of member 122 in chamber 114 will contact lead 112 because of the spring-loading so that current may flow between lead 112 and member 122.

Member 122 has another portion which extends outside the chamber through opening 106 as shown in FIG. 7. Member 122 is held to housing 102 by a fastening means 124, such as a plastic retainer. Portion 122a of the member 122 is adapted for connection to other electronic components. The socket 100 is frequently used in test equipment for testing semiconductor packages or other electronic components. Thus portion 122a may be soldered onto a printed circuit board used for testing a semiconductor package or an electronic component. The terminal or lead 112 of the package or component is inserted through opening 104 to make electrical contact with member 122. Member 122 is connected to other components on the printed circuit board used for testing the package or components.

Since lead 112 is electrically connected to member 122, current or voltage may be applied to lead 112 through member 122 in order to test the components. In conventional sockets, member 122 is made of phosphor bronze or berrylium copper, which are "soft" materials. Applicants propose the use of materials which are "harder" and more wear-resistant, so that member 122 will have a longer useful life. This can be done by adding an electrically conducting ferromagnetic material to an electrically conducting non-ferromagnetic material for making the member 122. The ferromagnetic material will add strength to the member and the non-ferromagnetic material will cause the member to have a low inductance so that switching noise and propagation delay will be low.

Various configurations for making member 122 are possible. The different configurations discussed above for the leadframe in FIGS. 6A-6E may be used for member 122 in the socket. More specifically, member 122 may be constructed in five different configurations where the cross-sectional views of member 122 along the line A—A in FIG. 7 are also shown in FIGS. 6A-6E, so that member 122 is made by incorporating a non-ferromagnetic path into or onto a ferromagnetic layer as the starting material. As yet another alternative, member 122 may be constructed, starting out with a non-ferromagnetic material, and plating or cladding thereto one or more ferromagnetic layers, as illustrated in FIGS. 6F and 6G, which are also cross-sectional views along the line A—A in FIG. 7. Still other configurations are possible where the ferromagnetic and non-ferromagnetic materials are intertwined, provided that self-inductance is reduced to a value below that of a ferromagnetic member and sufficient rigidity is provided for socket 100. All such configurations are within the scope of the invention.

In the application of the invention to semiconductor packages discussed above in reference to FIGS. 4–6, the application has been illustrated by reference to plastic-type packages. This invention is also applicable to ceramic-type packages to reduce the self-inductance of leads and fingers in such packages.

FIG. 8 is a cross-sectional view of a typical cofired ceramic package and FIG. 9 is a top view of a typical cofired ceramic package with the lid removed to illustrate the invention. In reference to FIGS. 8 and 9, package 200 includes a base 202 for supporting a die 204. Base 202 also supports a plurality of leads or fingers 222 which extend to the vicinity of the die. The fingers or leads 222 are connected to selected points on the die by bonding wires 224. Package 200 also has a plurality of external terminals or leads 232 which are electrically connected to corresponding leads or fingers 222 inside the package (connections not shown). Thus if leads 232 are connected to other devices, such as through printed circuit boards, selected points of the die 204 are then connected electrically to such devices through bonding wires 224, fingers 222 and leads 232.

Leads 232 are frequently made from a ferromagnetic material. Fingers 222 are typically made of tungsten. For reasons similar to those discussed above for plastic-type packages, the ferromagnetic material in leads 232 will introduce self-inductance which is undesirable. This invention is applicable to package 200 for reducing self-inductance. Where leads 232 are made starting from a ferromagnetic material, a non-ferromagnetic path may be provided between ends 222a of the fingers and end 232a of the terminal. If a cross-sectional view is taken across line A—A, FIG. 8, the cross-sectional view can take on a number of configurations, some of which are similar to those in FIGS. 6A-6E. Alternatively, leads 232 may be constructed using a non-ferromagnetic material. In such event, a ferromagnetic material may be plated or cladded onto leads 232 so that the cross-sectional view along the line A—A can again take on a number of configurations, some of which are similar to those illustrated in FIGS. 6F and 6G. The ferromagnetic material added will improve rigidity of leads 232. Obviously, other manners of intertwining ferromagnetic and non-ferromagnetic materials may be possible for constructing leads 232; all such configurations are within the scope of the invention.

In addition to cofired ceramic packages, the invention is also applicable to cerdip-type ceramic packages. Cerdip-type packages are similar in construction to plastic-type packages of the type shown in FIG. 4. Thus the package of FIG. 4 is useful to illustrate the cerdip-type packages as well. Package 20 in FIG. 4 illustrates a cerdip-type package except for the plastic material 300 which is shown in FIG. 4 to be a solid body in contact with the die attach pad the die bonding wires and lead portions of 22b of the lead frame. In a cerdip-type package, however, the plastic body 300 is replaced by a ceramic shell with a cavity inside where the die attach pad 22a, die 24, bonding wires 32, and lead portions 22b and spot plating layers 26 are situated inside the cavity. An additional difference between the cerdip-type package and that illustrated in FIG. 4 is that the spot plating layers 26 are made of aluminum in cerdip-type packages instead of silver, as shown in FIG. 4. Aside from these differences, the remaining features in FIG. 4 illustrate perfectly a cerdip-type package. Therefore, if the outer ceramic shell is removed and the center portion of the package is viewed along direction 5 shown in FIG. 4, the die attach pad, lead portions 22b, the die 24, and bonding wires 32 are accurately represented in FIG. 5. As illustrated in FIGS. 5 and 6A-6E, the cross-sectional view of leads 22 may take on a number of configurations, including those shown in FIGS. 6A-6E, where the leads 22 are made starting with a ferromagnetic material and a non-ferromagnetic path is added thereto. Alternatively, leads 22 in a cerdip-type package may also be made starting with a non-ferromagnetic material and improved in rigidity and wear-resistance by adding a ferromagnetic material thereto as illustrated in FIGS. 6F and 6G. Obviously, other manners of constructing leads 22 where an electrically conducting non-ferromagnetic material is intertwined with an electrically conducting ferromagnetic material may be used; all such configurations are within the scope of the invention.

The invention has been described above by reference to various embodiments. It will be understood, however, that various modifications and changes may be made without departing from the invention whose scope was to be limited only by the appended claims.

What is claimed is:

1. A lead structure for electrically connecting an electronic component to other devices, said structure comprising:
    a layer of an electrically conducting ferromagnetic first material, said layer having a portion forming a terminal suitable for electrical connection to other devices and a lead or finger near the component for electrical connection to the component;
    bonding pad means near the component and suitable for connection to the component through connection means; and
    a continuous path made of an electrically conducting non-ferromagnetic second material on or in said layer or separated from said layer by another intermediate layer, said path directly contacting and electrically connecting the bonding pad means to said terminal wherein said second material is other than gold, silver, copper or aluminum, so that the self inductance of the structure is reduced.

2. The structure of claim 1, wherein the path is located on and substantially encloses the layer of first material.

3. The structure of claim 1, wherein said path forms one or more layers of substantially the same area and shape as the layer of first material, said layer of first material being attached to said layers forming the path to form a stack, wherein the layers are attached to one another by a cladding or spot-plating process.

4. The structure of claim 1, wherein said non-ferromagnetic material is palladium or tin.

5. The structure of claim 1, wherein said structure forms part of a leadframe for supporting the component.

6. The structure of claim 1, wherein said structure forms part of a ceramic package.

7. The structure of claim 1, wherein said path has a cross section such that its cross-sectional dimensions are between about 50 and 100 microinches so that the self inductance of the structure is reduced.

8. The structure of claim 7, wherein the path forms a second layer on top of the layer of ferromagnetic material, wherein the thickness of the second layer is in the range of about 50 to 100 microinches.

9. The structure of claim 1, wherein said intermediate layer is made of nickel or titanium for reducing diffusion and to enhance adhesion of the path to the layer of ferromagnetic.

10. A lead structure for electrically connecting an electronic component to other devices, said structure comprising:
    a layer of an electrically conducting non-ferromagnetic first material, said layer having a portion forming a terminal suitable for electrical connection to other devices and a lead or finger near the component for electrical connection to the component, said layer forming a continuous path;
    bonding pad means near the component and suitable for connection to the component through connection means, said path directly contacting and electrically connecting said bonding pad means to said terminal to reduce the self inductance of the structure; and
    one or more second layers of an electrically conducting ferromagnetic second material on or separated by the layer of first material by an intermediate layer and covering at least a portion of the first layer to provide rigidity for the structure,
    wherein the second layers substantially enclose the layer of first material, except for the terminal and the finger or lead.

11. The structure of claim 10, wherein said intermediate layer is made of nickel or titanium for reducing diffusion and to enhance adhesion of the second material to the layer of first material.

12. The structure of claim 10, wherein said second layers are of substantially the same area and shape as the layer of first material, said layer of first material being attached to said second layers forming to form a stack, wherein the layers are attached to one another by a cladding or spot-plating process.

13. The structure of claim 10, wherein said non-ferromagnetic material is copper, gold, silver, aluminum, palladium or tin.

14. The structure of claim 10, wherein said structure forms part of a leadframe for supporting the component.

15. The structure of claim 10, wherein said structure forms part of a ceramic package.

16. The structure of claim 10, wherein said layer of first material has a thickness that is in the range of about 50 to 100 microinches so that the self inductance of the structure is reduced.

17. A socket for use with a semiconductor package, said package having leads, said socket comprising:
 a housing having a chamber therein, said chamber having a first opening for receiving a lead of the package and a second opening; and
 an electrically conducting elongated member inside the chamber positioned to contact at a first point the lead of the package after the lead is inserted into the chamber, said member having a portion which extends outside the chamber through the second opening, said portion suitable for connection at a second point to other devices so as to electrically connect the lead of the package to such other devices, said member composed of a ferromagnetic first material to provide rigidity to the member and a non-ferromagnetic electrically conducting second material to reduce self inductance, said second material in direct contact with said lead at said first point and to said other devices at said second point and forming a path extending continuously between said first point and said second point.

18. The socket of claim 17, the member is composed of an inner core of the first material and an outer layer of the second material.

19. The structure of claim 1, wherein said component and said lead or finger are enclosed in a housing, and wherein the terminal is outside the housing.

20. A lead structure for electrically connecting an electronic component to other devices, said structure comprising:
 a layer of an electrically conducting non-ferromagnetic first material, said layer having a portion forming a terminal suitable for electrical connection to other devices and a lead or finger near the component for electrical connection to the component; and
 one or more second layers on an electrically conducting ferromagnetic second material on or separated from by the layer of first material by an intermediate layer and covering at least a portion of the first layer to provide rigidity for the structure,
 wherein said non-ferromagnetic material is palladium.

* * * * *